(12) United States Patent
Chen et al.

(10) Patent No.: US 7,389,488 B2
(45) Date of Patent: Jun. 17, 2008

(54) METHOD OF FINDING DRIVING STRENGTH AND COMPUTER ACCESSIBLE RECORD MEDIUM TO STORE PROGRAM THEREOF

(75) Inventors: Peter H. Chen, Taoyuan County (TW); Chih-Fu Chien, Taipei (TW); Han-chi Liu, Hsinchu County (TW); Jyh-Herng Wang, Hsinchu County (TW)

(73) Assignee: Faraday Technology Corp., Hsin-Chu (TW)

( * ) Notice: Subject to any disclaimer, the term of this patent is extended or adjusted under 35 U.S.C. 154(b) by 0 days.

(21) Appl. No.: 10/908,748

(22) Filed: May 25, 2005

(65) Prior Publication Data

US 2006/0271889 A1  Nov. 30, 2006

(51) Int. Cl.
*G06F 17/50* (2006.01)
*H03K 19/00* (2006.01)
(52) U.S. Cl. ........................................................ 716/17
(58) Field of Classification Search ................. 716/10, 716/4–6, 17
See application file for complete search history.

(56) References Cited

U.S. PATENT DOCUMENTS

| | | | | |
|---|---|---|---|---|
| 5,875,114 A * | 2/1999 | Kagatani et al. | ................ | 716/6 |
| 6,038,384 A * | 3/2000 | Ehrler | ............................ | 716/6 |
| 2002/0010901 A1* | 1/2002 | Otaguro | ........................ | 716/12 |
| 2003/0070148 A1* | 4/2003 | Chang et al. | ..................... | 716/5 |
| 2004/0210689 A1* | 10/2004 | Tanaka | .......................... | 710/58 |
| 2006/0123369 A1* | 6/2006 | Zolotykh et al. | ............... | 716/6 |
| 2006/0218519 A1* | 9/2006 | Ichimiya | ....................... | 716/17 |

* cited by examiner

*Primary Examiner*—Paul Dinh
*Assistant Examiner*—Suresh Memula
(74) *Attorney, Agent, or Firm*—Winston Hsu

(57) ABSTRACT

A method of finding a driving strength and a record medium accessible by a computer to store a program thereof are provided. The method is adapted to find the driving strength of an output pin of a target cell. Wherein, the driving strength of the output pin of the target cell is provided from the driving strength of a corresponding last level device. In this method, at least one candidate standard cell is searched in a standard cell library according to the last level device. Then, the driving strength of the target cell is interpolated between the driving strengths of the candidate standard cells to obtain the driving strength of the output pin of the target cell.

16 Claims, 3 Drawing Sheets

METHOD OF FINDING DRIVING STRENGTH AND COMPUTER ACCESSIBLE RECORD MEDIUM TO STORE PROGRAM THEREOF

BACKGROUND OF THE INVENTION

1. Field of the Invention

The present invention relates to a method of finding a driving strength, and particularly to a method of finding an output driving strength of a target cell, such as an intellectual property cell, from a mixed-signal integrated circuit, and a record medium accessible by a computer program to execute the method thereof.

2. Description of the Related Art

Due to the trend of high density of integrated circuits and time-to-market products, how to develop a cost-effective integrated circuit in a shortest time becomes an essential topic. Design reuse is one approach to solve the issue. In other words, various designed/laid-out circuits are reused and assembled by application specific integrated circuits (ASIC). Accordingly, development of chip products can be accomplished in a shortest time. The aforesaid repeatedly used designed/laid-out circuit is called an intellectual property (IP) cell.

Before using IP cells to design integrated circuits, the output driving strength of the cells are needed by the IC designers. Generally, driving strengths of output pins of a cell are represented by maximum load capacitances. Cell attributes including the output driving strengths of standard cells (maximum load capacitances), are recorded in a standard cell library. Normally, the best, the typical, and the worst driving strengths of each standard cell can be found in the best, the typical, and the worst standard cell libraries, respectively.

For cells not included in the standard cell library, a SPICE model or other simulation software must be used to analyze the target cell for obtaining the driving strengths of the output pins, including the bi-directional pins, of the target cell. If the target cell which is going to be simulated is very complicated, the required time for simulation will exponentially and dramatically increase. For example, the HSPICE software provided by Synopsys Co. simulates the timing delay of the phase locked loop (PLL) may take 4-5 days and Analog-to-Digital Converter (ADC) may take 3+ weeks. Moreover, in order to find the driving strengths of the cell, the SPICE needs executing more steps and will be very time consuming, such as several months. The length of execution time grows exponentially is called Non-Polynimial (NP) problem. Accordingly, the use of the SPICE simulation software to analyze the driving strengths of the target cell, such as the IP cell, wastes a lot of time and becomes impractical.

SUMMARY OF THE INVENTION

Accordingly, the present invention is directed to a method of finding a driving strength so as to quickly obtain the driving strength of the output pin of a target IP cell.

The present invention is also directed to a record medium accessible by a computer to store the program with the attributes described above.

The present invention provides a method of finding a driving strength. The method is adopted to find a driving strength of at least one output pin of a target cell, wherein the driving strength of the output pin of the target cell is provided by at least one corresponding last level device. In this method, a group of candidate cells (containing at least one candidate standard cell) is built from the standard cell library according to the last level of the IP device. A driving strength of the target cell is interpolated between the driving strengths of the set of candidate of standard cells to obtain the driving strength of the output pin provided by the last level device of the IP.

According to the method of finding the driving strength of a preferred embodiment of the present invention, a partial circuit of the target cell is adopted and analyzed to obtain the driving strength of the output pin, if the step of interpolation fails to find the driving strength of the last level device.

According to the method of finding the driving strength of a preferred embodiment of the present invention, adopting and analyzing the partial circuit of the target cell comprises the following steps. The partial circuit including at least one second last level device and the last level device, wherein the second last level device is coupled to and drives the last level device. The testing signal(s) is/are provided by an input terminal of the second last level device. The driving strength is measured at the output pin.

According to the method of finding the driving strength of a preferred embodiment of the present invention, the method further comprises the following steps: determine whether the last level device is a standard input/output (IO) cell, wherein the standard IO cell comprises a pad for external connection. An original connection of an input terminal of the last level device is removed if the last level device is the standard IO cell; at least one testing signal is provided by the input terminal of the last level device. The driving strength is measured at the output pin.

According to the method of finding the driving strength of a preferred embodiment of the present invention, the method further comprises the following steps. A mapping table between the target cell library and the standard cell library is established. An input/output pin table of the target cell is established. The output pins of the target cell are selected one by one. A standard cell candidate table is established according to the output pins which are selected.

According to the method of finding the driving strength of a preferred embodiment of the present invention, the target cell is an intellectual property (IP) cell. Wherein, the IP cell is described with a library format, such as Synopsys Libraty Format. Additionally, the driving strength of the output pin of the target cell represents a maximum load capacitance of an attribute in the library which can be driven by the output pin. Moreover, the output pin of the target cell is a digital output pin, for example.

The present invention provides a record medium accessible by a computer program. The program comprises the following commands. A target cell is accessed. The target cell comprises at least one output pin, wherein a driving strength of the output pin of the target cell is provided by at least one corresponding last level device. At least one set of candidate of standard cell is built from a standard cell library according to the last level device. A driving strength of the target standard cell is interpolated between the driving strengths of the set of candidate of standard cells to obtain the driving strength of the output pin provided by the last level device.

According to the record medium accessible by a computer of a preferred embodiment of the present invention, the program further comprises the following command. A partial circuit of the target cell is adopted and analyzed to obtain the driving strength of the output pin if the step of interpolation cannot find the driving strength of the last level device.

According to the record medium accessible by a computer of a preferred embodiment of the present invention, adopting and analyzing the partial circuit of the target cell comprises the following steps. The partial circuit including at least one second last level device and the last level device are adopted, wherein the second last level device is coupled to and drive the last level device. At least one testing signal is provided by an input terminal of the second last level device. The driving strength is measured at the output pin.

According to the record medium accessible by a computer of a preferred embodiment of the present invention, the program further comprises the following commands: determine whether the last level device is a standard input/output (IO) cell, wherein the standard IO cell comprises a pad for external connection; an original connection of an input terminal of the last level device is removed if the last level device is the standard IO cell; at least one testing signal is provided by the input terminal of the last level device; the driving strength is measured at the output pin.

In the present invention, the driving strength of the target cell is interpolated between of the driving strengths of the set of candidate of standard cells in the standard cell library, or to adopt and analyze the partial circuit of the target cell. Accordingly, the driving strength of the output pin of the target cell can be obtained soon.

The above and other features of the present invention will be better understood from the following detailed description of the preferred embodiments of the invention that is provided in communication with the accompanying drawings.

DESCRIPTION OF SOME EMBODIMENTS

In these embodiments described below, the target cell can be, for example, an intellectual property (IP) cell described by a Library Format or other cells. The target cell thus can be accessed by a computer system, and can be further processed by an electronic design automation (EDA) program. In these embodiments, an IP cell represents the target cell. In addition, in these embodiments the maximum load capacitance, e.g., maximum capacitance, of the output pin of the cell represents the driving strength.

Figure 1:
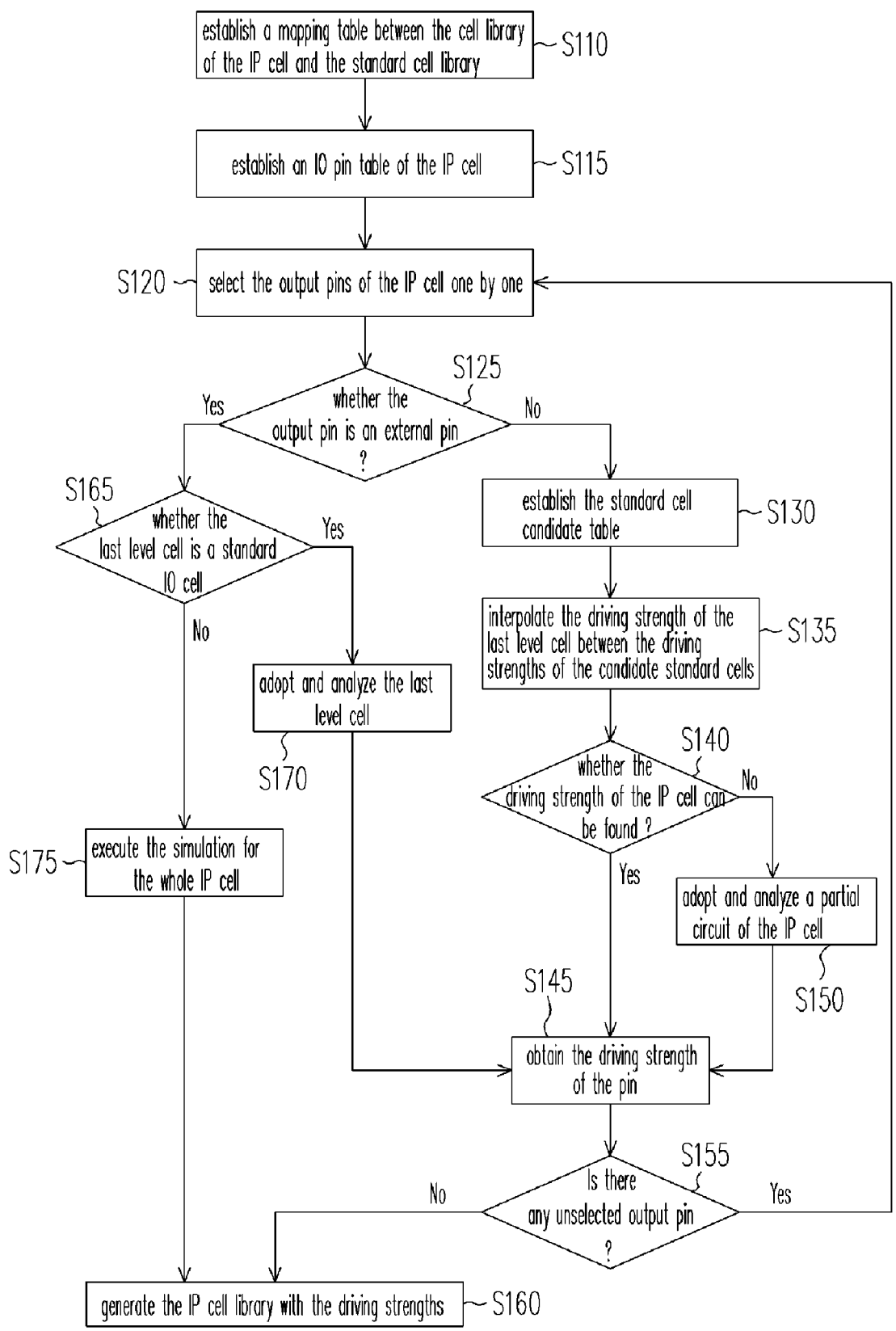
FIG. 1 is a flowchart showing a method of finding a driving strength according to a preferred embodiment of the present invention.

FIG. 1 is a flowchart showing a method of finding a driving strength according to a preferred embodiment of the present invention. Referring to FIG. 1, the cell library of the IP cell and the standard cell library are accessed and analyzed to establish a mapping table between them in step S110. In the mapping table, the corresponding relationship between the sub-cells in the IP cell and the standard cells of the standard cell library are indicated.

In step S115, the input/output (IO) pintable of the IP cell is established. Since the analog output pins, including bi-directional pins, do not drive digital cells, i.e., the information related to the slew rate and the maximum load capacitance is not included. Therefore, the description of the analog IO pins is skipped in these embodiments.

In step S120, the output pins are selected one by one according to the IO pin table of the IP cell by repeating the steps from S125-S165. The step S125 determines whether the present selected output pin is an external pin. The external pin is coupled to the external pin of the integrated circuit and accompanied by specific 10 cells. The output cell comprises pads for external connection.

Figure 2:
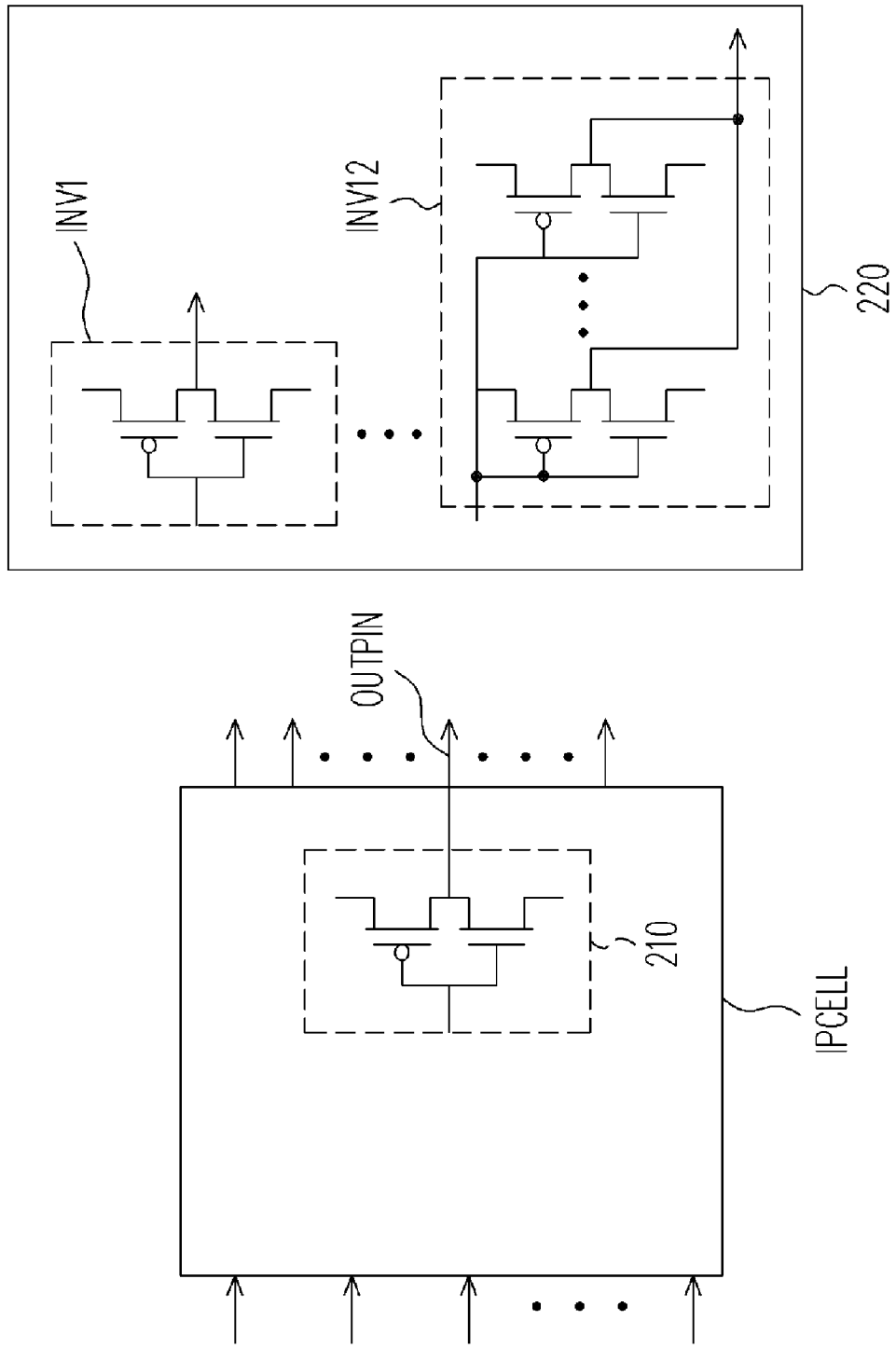
FIG. 2 is a drawing showing a last level device coupled to the output pins of an IP cell, and a standard cell candidate table according to an embodiment of the present invention.

If the present selected output pin is a digital external pin, step S165 will be executed. Contrarily, if the present selected output pin is not an external pin, step S130 will be executed. In step S130, the standard cell candidate table is established according to the selected output pins. FIG. 2 is a drawing showing a last level device coupled to output pins of an IP cell, and a standard cell candidate table according to an embodiment of the present invention. The IP cell IPCELL comprises a plurality of output pins, wherein a single last level device 210 provides the driving strength to the output pin OUTPIN, for example. Generally, the last level device coupled to the output pins is an NOT gate. In this embodiment, the standard cell candidate table 220 comprises a plurality of candidate standard cells INV1-INV12 found in the standard cell library according to the last level device 210. For example, if the length and width of the gate of the last level device 210 are L and W, respectively, the candidate standard cells INV1-INV12 are NOT gates with the same length L, but different widths W1-W12, respectively.

Step S135 interpolates the driving strength of the target cell between the driving strengths of the candidate standard cells to obtain the driving strength, i.e., the maximum load capacitance, of the output pin provided by the last level device. For example, in FIG. 2 the candidate standard cells INV1-INV12 of the standard cell candidate table 220 are standard cells of the standard cell library. Accordingly, the maximum load capacitances of the candidate standard cells INV1-INV12 can be obtained. The last level device 210 and the candidate standard cells INV1-INV12 have the same gate length. The cells of the candidate standard cells INV1-INV12 which have the gate width mostly similar to that of the last level device 210 are selected for interpolation to obtain the maximum load capacitance, i.e., the maximum load capacitance of the output pin OUTPIN. For example, if the gate width of the last level device 210 is between those of the candidate standard cells INV1 and INV2, the candidate standard cells INV1 and INV2 are thus selected for interpolation.

Step S140 determines whether the maximum load capacitance of the last level device can be measured by interpolating its capacitance between the maximum load capacitances of the candidate standard cells. If the interpolation method can obtain the maximum load capacitance, generally including the best, the typical, and the worst of the last level device, the maximum load capacitance also represents the driving strength of the output pin in step S145. The found driving strength of the output pin is thus stored, and other output pins whose driving strengths have not been found are being checked in step S155. Then step S120 is performed to select the next output pin of the IP cell, i.e., the target cell.

Figure 3:
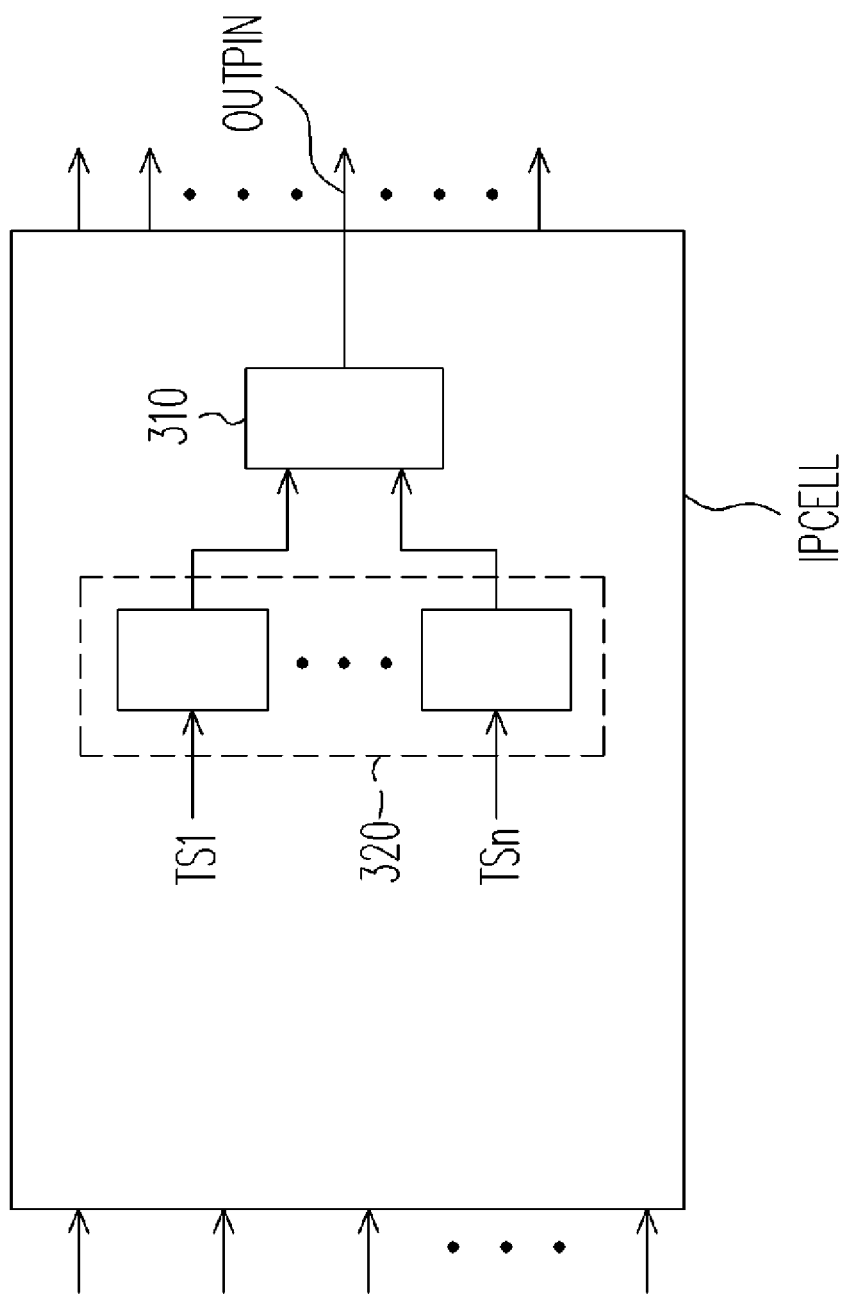
FIG. 3 is a schematic drawing showing an adopted partial circuit of an IP cell according to an embodiment of the present invention.

If the interpolation method cannot find the driving strength provided by the last level device, step S150 is executed to adopt and analyze a partial circuit of the target cell in order to obtain the driving strength of the output pin. FIG. 3 is a schematic drawing showing an adopted partial circuit of an IP cell according to an embodiment of the present invention. The IP cell IPCELL comprises a plurality of output pins, wherein the driving strength of the output pin OUTPIN is provided by a signal last level device 310, for example. A plurality of second last level devices 320 are coupled to and drive the last level device 310. In this embodiment, a second level circuit, i.e., the second last level device 320 and the last level device 310, of the IP cell IPCELL is adopted for the circuit simulation analysis through the output pin OUTPIN. Testing signals TS1-TSn are provided to the input terminal of the second last level device 320. The driving strength is measured at the output terminal OUTPIN. One of the ordinary skilled in the art knows that the last level device, the last third cell or any other level device can be adopted and serves as the circuit for simulation analysis.

Referring to FIG. 1, in step S125 if the present selected output pin is an external pin, step S165 will be executed. Step S165 determines whether the last level device coupled to the present selected output pin is a standard IO cell. If the last level device is a standard IO cell, the last level device is adopted for simulation analysis by an SPICE model (step S170). For example, the original connection of the input terminal of the last level device is removed, and the testing signals are provided to the input terminal of the last level device. Accordingly, the driving strengths, generally including the best, the typical, and the worst, can be measured and obtained at the output pin. After step S145 in which the found driving strengths of the output pins are thus stored, other output pins whose driving strengths have not been found are being checked in step S155. Then step S120 is performed to select the next output pin of the IP cell, i.e., the target cell.

When step S155 determines that there are no more unselected output pins, the driving strengths of all output pins of the IP cell, i.e., the target cell, are combined to generate the IP cell library with the driving strengths (step S160).

In addition, if step S165 determines that the last level device is not a standard IO cell, step S175 is then performed. The SPICE model or other simulation software performs simulation analysis of the IP cell, i.e., the target cell, to obtain the driving strengths of each output pin, including bi-directional pins, of the IP cell. Then, the driving strengths of the output pins of the IP cell are combined to generate the IP cell library with the driving strengths (step S160).

In summary, in the present invention the driving strength of the target cell is interpolated between the driving strengths of the standard cell in the standard cell library to adopt and analyze the partial circuit of the target cell. Accordingly, the driving strengths of the output pin of the target cell can be obtained soon.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. A method for finding a driving strength of at least one output pin of a target cell, comprising:
    determining whether the output pin of the target cell being a digital external pin;
    searching a plurality of candidacy standard cells in a standard cell library according to a last level device within the target cell which being connected to the output pin of the target cell and used for providing the driving strength to the output pin of the target cell when the output pin of the target cell being not the digital external pin;
    establishing a standard cell candidacy table according to the candidacy standard cells, wherein the standard cell candidacy table comprises driving strengths of the candidacy standard cells;
    performing interpolation calculation between the driving strengths of the candidacy standard cells so as to obtain the driving strength of the output pin of the target cell; and
    analyzing a partial circuit of the target cell so as to obtain the driving strength of the output pin of the target cell if the interpolation calculation between the driving strengths of the candidacy standard cells being incapable of obtaining the driving strength of the output pin of the target cell;
    wherein the partial circuit of the target cell comprises a partial circuit of the last level device and a partial circuit of at least one second last level device within the target cell which is connected to input terminals of the last level device and used for driving the last level device.

2. The method according to claim 1, further comprising:
    providing at least one testing signal to input terminal s of the second last level device; and
    measuring the output pin of the target cell so as to obtain the driving strength of the output pin of the target cell.

3. The method according to claim 1, wherein if the output pin of the target cell is the digital external pin, the method further comprises:
    determining whether the last level device connected to the output pin of the target cell being a standard input/output (IO) cell, wherein the standard IO cell comprises a pad for external connection;
    removing connection of an input terminal of the last level device if the last level device being the standard IO cell;
    providing at least one testing signal to the input terminal of the last level device; and
    measuring the output pin of the target cell so as to obtain the driving strength of the output pin of the target cell.

4. The method according to claim 3, further comprising:
    using a HSPICE software to simulate and analyze the target cell so as to obtain the driving strength of the output pin of the target cell if the last level device being not the standard IO cell.

5. The method according to claim 1, wherein before the step of "determining whether the output pin of the target cell being a digital external pin", the method further comprises:
    establishing a mapping table between a cell library of the target cell and the standard cell library;
    establishing an input/output pin table of the target cell; and
    selecting output pins of the target cell one by one according to the input/output pin table of the target cell.

6. The method according to claim 1, wherein the target cell is an intellectual property (IP) cell.

7. The method according to claim 6, wherein the IP cell is described by a hardware description language (HDL).

8. The method according to claim 1, wherein the driving strength of the output pin of the target cell represents a maximum load capacitance driven by the output pin of the target cell.

9. A record medium accessible by a computer to execute a program stored in a computer system, the program comprising the following commands:
    accessing a target cell, wherein the target cell comprises at least one output pin;
    determining whether the output pin of the target cell being a digital external pin;
    searching a plurality of candidacy standard cells in a standard cell library according to a last level device within the target cell which being connected to the output pin of the target cell and used for providing the driving strength to the output pin of the target cell when the output pin of the target cell being not the digital external pin;
    establishing a standard cell candidacy table according to the candidacy standard cells, wherein the standard cell candidacy table comprises driving strengths of the candidacy standard cells;

performing interpolation calculation between the driving strengths of the candidacy standard cells so as to obtain the driving strength of the output pin of the target cell; and analyzing a partial circuit of the target cell so as to obtain the driving strength of the output pin of the target cell if the interpolation calculation between the driving strengths of the candidacy standard cells being incapable of obtaining the driving strength of the output pin of the target cell;

wherein the partial circuit of the target cell comprises a partial circuit of the last level device and a partial circuit of at least one second last level device within the target cell which is connected to input terminals of the last level device and used for driving the last level device.

10. The record medium accessible by a computer according to claim 9, wherein the program further comprises the following commands:

providing at least one testing signal to input terminals of the second last level device; and measuring the output pin of the target cell so as to obtain the driving strength of the output pin of the target cell.

11. The record medium accessible by a computer according to claim 9, wherein if the output pin of the target cell is the digital external pin, the program further comprises the following commands:

determining whether the last level device connected to the output pin of the target cell being a standard input/output (IO) cell, wherein the standard IO cell comprises a pad for external connection;

removing connection of an input terminal of the last level device if the last level device being the standard IO cell;

providing at least one testing signal to the input terminal of the last level device; and measuring the output pin of the target cell so as to obtain the driving strength of the output pin of the target cell.

12. The record medium accessible by a computer according to claim 11, wherein the program further comprises the following command:

using a HSPICE software to simulate and analyze the target cell so as to obtain the driving strength of the output pin of the target cell if the last level device being not the standard IO cell.

13. The record medium accessible by a computer according to claim 9, wherein before the command of "determining whether the output pin of the target cell being a digital external pin" and after the command of "accessing a target cell", the program comprises the following commands:

establishing a mapping table between a cell library of the target cell and the standard cell library;

establishing an input/output pin table of the target cell; and selecting output pins of the target cell one by one according to the input/output pin table of the target cell.

14. The record medium accessible by a computer according to claim 9, wherein the target cell is an IP cell.

15. The record medium accessible by a computer according to claim 14, wherein the IP cell is described by a HDL.

16. The record medium accessible by a computer according to claim 9, wherein the driving strength of the output pin of the target cell represents a maximum load capacitance driven by the output pin of the target cell.

* * * * *